(12) United States Patent
Labonte et al.

(10) Patent No.: US 10,014,215 B2
(45) Date of Patent: Jul. 3, 2018

(54) METHOD AND APPARATUS FOR PLACING A GATE CONTACT INSIDE A SEMICONDUCTOR ACTIVE REGION HAVING HIGH-K DIELECTRIC GATE CAPS

(71) Applicant: GLOBALFOUNDRIES Inc., Grand Cayman (KY)

(72) Inventors: Andre Labonte, Mechanicville, NY (US); Ruilong Xie, Schenectady, NY (US); Xunyuan Zhang, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/689,413

(22) Filed: Aug. 29, 2017

(65) Prior Publication Data

US 2018/0012798 A1 Jan. 11, 2018

Related U.S. Application Data

(62) Division of application No. 15/202,817, filed on Jul. 6, 2016, now Pat. No. 9,824,921.

(51) Int. Cl.
*H01L 23/522* (2006.01)
*H01L 21/768* (2006.01)
*H01L 21/8234* (2006.01)
*H01L 23/532* (2006.01)
*H01L 23/535* (2006.01)
(Continued)

(52) U.S. Cl.
CPC .. *H01L 21/76897* (2013.01); *H01L 21/76802* (2013.01); *H01L 21/76805* (2013.01); *H01L 21/76889* (2013.01); *H01L 21/823431* (2013.01); *H01L 23/5226* (2013.01); *H01L 23/535* (2013.01); *H01L 23/53209* (2013.01); *H01L 29/41791* (2013.01); *H01L 29/66795* (2013.01); *H01L 29/7851* (2013.01)

(58) Field of Classification Search
CPC ......... H01L 21/76802; H01L 21/76889; H01L 21/76897; H01L 21/823431; H01L 23/5226; H01L 23/53209; H01L 23/53257; H01L 29/41791; H01L 29/66795; H01L 29/785; H01L 29/7851; H01L 2029/7858
See application file for complete search history.

(56) References Cited

U.S. PATENT DOCUMENTS 9,431,296 B2 8/2016 Basker et al.
9,496,225 B1 11/2016 Adusumilli et al.
(Continued)

OTHER PUBLICATIONS

U.S. Appl. No. 15/202,764, filed Jul. 6, 2016.

*Primary Examiner* — Stephen W Smoot
(74) *Attorney, Agent, or Firm* — Heslin Rothenberg Farley & Mesiti P.C.; Stephen P. Scuderi (57) ABSTRACT

A method provides a structure having a FinFET in an Rx region, the FinFET including a channel, source/drain (S/D) regions and a gate, the gate including gate metal. A cap is formed over the gate having a high-k dielectric liner and a core. Trench silicide (TS) is disposed on sides of the gate. The TS is recessed to a level above a level of the gate and below a level of the cap. An oxide layer is disposed over the structure. A CB trench is patterned into the oxide layer within the Rx region to expose the core and liner at an intermediate portion of the CB trench. The core is selectively etched relative to the liner to extend the CB trench to a bottom at the gate metal. The CB trench is metalized to form a CB contact.

10 Claims, 13 Drawing Sheets

(51) Int. Cl.
*H01L 29/417* (2006.01)
*H01L 29/66* (2006.01)
*H01L 29/78* (2006.01)

(56) References Cited

U.S. PATENT DOCUMENTS

| | | |
|---|---|---|
| 9,634,113 B2 | 4/2017 | Rubin et al. |
| 9,824,921 B1 | 11/2017 | Labonte et al. |
| 2016/0013104 A1 | 1/2016 | Hung et al. |
| 2016/0359009 A1 | 12/2016 | Xie et al. |
| 2016/0365424 A1 | 12/2016 | Basker et al. |
| 2017/0047250 A1 | 2/2017 | Leobandung et al. |
| 2017/0047253 A1 | 2/2017 | Park et al. |
| 2017/0053997 A1 | 2/2017 | Cheng et al. |
| 2017/0110549 A1 | 4/2017 | Xie et al. |
| 2017/0125530 A1 | 5/2017 | Zhang et al. |
| 2017/0256444 A1 | 9/2017 | Chang et al. |
| 2017/0301773 A1 | 10/2017 | Park et al. |
| 2018/0012887 A1 | 1/2018 | Labonte et al. |

METHOD AND APPARATUS FOR PLACING A GATE CONTACT INSIDE A SEMICONDUCTOR ACTIVE REGION HAVING HIGH-K DIELECTRIC GATE CAPS

CROSS REFERENCE TO RELATED APPLICATIONS

This application is a divisional of U.S. patent application Ser. No. 15/202,817 filed Jul. 6, 2016, now U.S. Pat. No. 9,824,921, entitled, "METHOD AND APPARATUS FOR PLACING A GATE CONTACT INSIDE A SEMICONDUCTOR ACTIVE REGION HAVING HIGH-K DIELECTRIC GATE CAPS." The above application is incorporated herein by reference in its entirety.

TECHNICAL FIELD

The present invention relates to semiconductor devices and methods of fabricating the same. More specifically, the invention relates to a method and apparatus for placing a gate contact inside an active region of a semiconductor structure.

BACKGROUND

Prior art semiconductor technology (e.g., 40 nanometer (nm), 14 nm and beyond) currently has most gate (CB) contacts disposed on a portion of the gate structure that is located outside of any active (Rx) region and over an isolation region such as a shallow trench isolation (STI) region, a deep trench isolation region or the like. This is done to prevent the high risk of electrically shorting to source/drain (CA) contacts or to the underlying trench silicide (TS) layers.

The possibility of CB contacts shorting to the TS layers is especially problematic. This is due to the fact that the TS layers extend longitudinally across an entire Rx region in order to ensure proper electrical contact with the source/drains (S/D) of FinFETs in an array of fins even under worst case misalignment conditions. Therefore, even though the CA contacts can be located in a localized area of the Rx region sufficiently distant from the CB contact to prevent shorts, the TS layers cannot.

In prior art 10 nm technology and beyond, self-aligned contact (SAC) nitride caps over the gate electrode metal are utilized to prevent shorting between CA contacts and the gate metal. The SAC caps are composed of a single material, typically silicon nitride (SiN), that generally has the same or similar material composition as the gate spacers over which the SAC caps are disposed. Between the gate spacers and SAC cap, the gate metal is completely isolated from the TS regions. With such caps, it is possible to do a deep TS recess below the level of the gate metal in an attempt to avoid shorting to CB contacts potentially disposed in the Rx region.

Problematically though, there are limits as to how deep the TS layer can be recessed without unacceptably increasing the electrical resistance through the TS layer. Therefore, even with such a deep TS layer recess, the CB contacts disposed over the gates become too close to the recessed TS to be reliably manufactured.

Placing the CB contacts outside of the Rx region is a detriment to scaling, especially for the 10 nm technology nodes and beyond. Additionally, CB contacts disposed over the isolation regions have additional design requirements that become more problematic with down scaling. For example, the CB contacts over isolation regions must always be located between two Rx regions, must have a minimum spacing between the CB contact and the fins and the TS regions, and the like.

Accordingly, there is a need for a method and apparatus that enables the placement of CB contacts inside of Rx regions of semiconductor structures. Moreover, there is need for such method and apparatus to be reliably manufacturable.

BRIEF DESCRIPTION

The present invention offers advantages and alternatives over the prior art by providing a method and apparatus for placing a CB contact inside of an Rx region of a semiconductor structure. Moreover, the method and apparatus improves the scalability of the semiconductor structure and is readily manufacturable.

A method of placing a CB contact in an Rx region of a semiconductor structure in accordance with one or more aspects of the present inventions includes providing a structure having a FinFET disposed in an Rx region. The FinFET includes a channel disposed between a pair of source/drain (S/D) regions and a gate (CB) disposed over the channel. The gate includes gate metal disposed between gate spacers. A cap is formed over the gate, the cap having a high-k dielectric outer liner disposed around an inner core. Trench silicide (TS) layers are formed on opposing sides of the gate over the S/D regions. The TS layers are recessed to a level above a level of the gate and below a level of the cap. An oxide layer is disposed over the structure. A CB trench is patterned into the oxide layer to expose the core at an intermediate portion of the CB trench. The CB trench is located within the Rx region. The core is selectively etched relative to the liner to further extend the CB trench to a trench bottom and to expose the gate metal. The CB trench is metalized to form a CB contact electrically connected to the gate metal.

In another aspect of the present invention a semiconductor structure includes a FinFET disposed in an Rx region. The FinFET includes a channel disposed between a pair of source/drain (S/D) regions and a gate disposed over the channel. The gate includes gate metal disposed between gate spacers. A cap, which includes a high-k dielectric outer liner disposed around an inner core, is disposed over the gate. The cap liner and core extends upwards from the gate to substantially a same first cap level. Trench silicide (TS) layers are disposed on opposing sides of the gate over the S/D regions. The TS layers have a level above a level of the gate and below the cap level. An oxide layer is disposed over the structure. A CB trench is disposed within the oxide layer and over the Rx region. The CB trench extends down to a trench intermediate portion located at substantially the cap level and further extends from the intermediate portion to a trench bottom. The trench bottom includes the gate metal. A CB contact is disposed within the CB trench and electrically connected to the gate metal.

DRAWINGS

The invention will be more fully understood from the following detailed description taken in conjunction with the accompanying drawings, in which.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1A-13B illustrate various exemplary embodiments of a method and apparatus for placing a gate (CB) contact inside of an active (Rx) region of a semiconductor structure in accordance with the present invention.

Figure 1A:
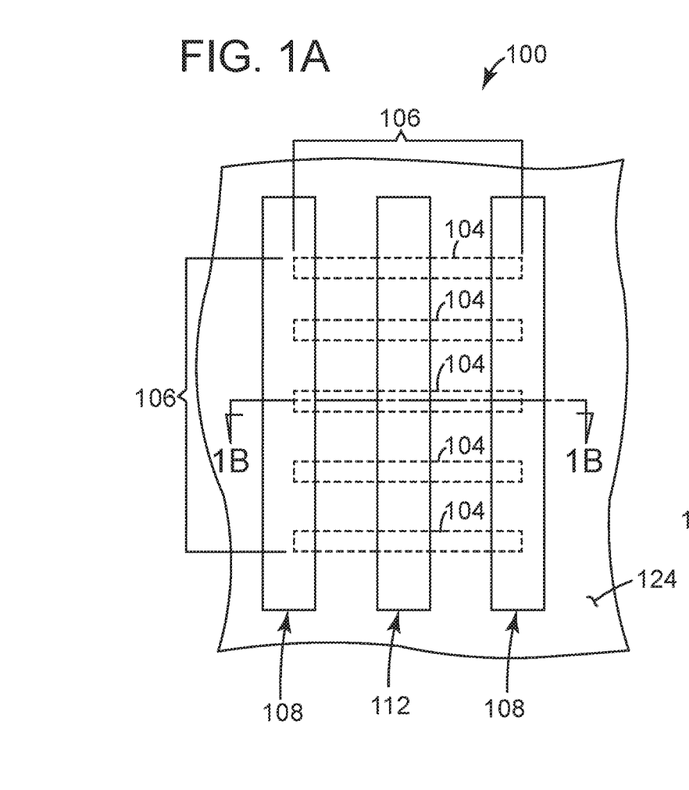
FIG. 1A is an exemplary embodiment of a simplified top planar view of a semiconductor structure at an intermediate stage of manufacturing in accordance with the present invention.
Figure 1B:
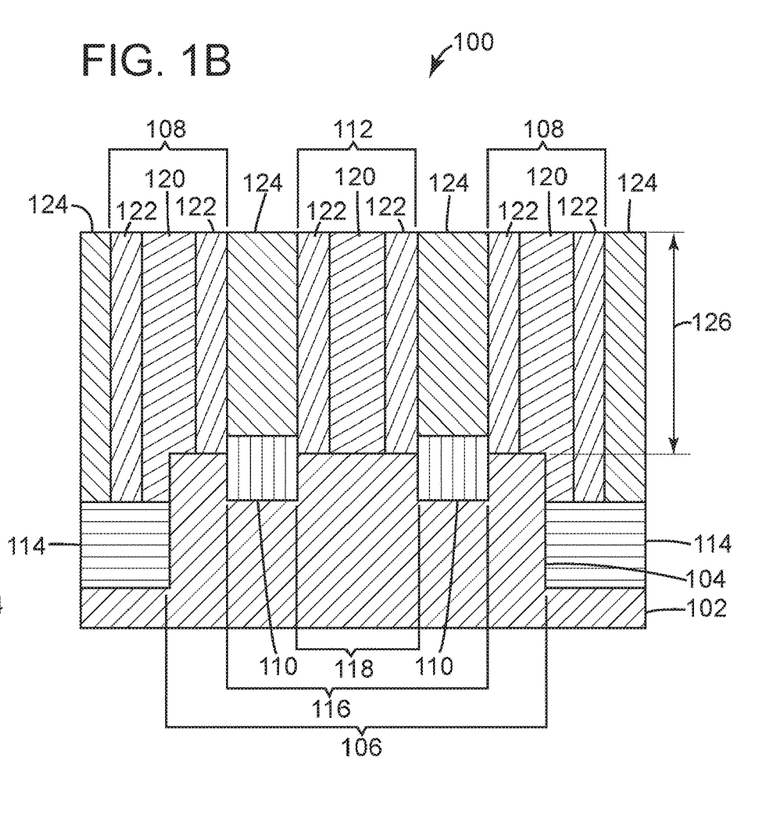
FIG. 1B is a simplified cross-sectional view of FIG. 1A taken along the line 1B-1B in accordance with the present invention.

Referring to FIGS. 1A and 1B, an exemplary embodiment of a simplified top planar view and a simplified cross-sectional view taken along the line 1B-1B of a semiconductor structure 100 in accordance with the present invention is presented at an intermediate stage of manufacturing. At this stage of the process flow, semiconductor structure 100 includes a substrate 102 having fins 104, which extend vertically upward from the substrate 102 and horizontally across the substrate to define an active (Rx) region 106 of the substrate 100. Fins 104 are disposed in a parallel array of fins (best seen in FIG. 1A) extending across the Rx region 106 of the substrate 102. The fins 104 are terminated by dummy gates 108, which extend laterally across the distal ends of the fins 104 at the edges of the Rx region 106. The dummy gates 108 are used to induce symmetrical epitaxial growth of source/drain (S/D) regions 110 on the portions of the fins 104 located between the dummy gates 108 and adjacent active gates 112.

Though only one active gate 112 is illustrated, gate 112 may be a plurality of active gates 112 (e.g., from a few to many thousands and more) that are disposed along fins 104 within the active region 106. Gates 112 extend generally perpendicular to fins 104 within the Rx region 106 and may also extend substantially into an isolation region 114. Additionally, though only two S/D regions 110 are shown, there typically are S/D regions 110 that are epitaxially grown into fins 104 between each of the many gates 112 within the Rx region 106 and between the active gates 112 and the dummy gates 108 at the boarders of the Rx region 106.

Bordering the Rx region 106 is the isolation region 114, such as a shallow trench isolation (STI) region, a deep trench isolation region or the like, that is used to separate the Rx region 106 from various other active regions (not shown) on semiconductor structure 100. Isolation region 114 is typically composed of an amorphous dielectric material, such as a flowable oxide (FOX) or the like.

A Fin Field Effect Transistor (FinFET) 116 is disposed within the fin 104 of the Rx region 106. The FinFET 116 includes the pair of S/D regions 110 and a channel 118 disposed therebetween. The gate 112 is disposed over the channel 118 and is operable to control electrical continuity through the channel 118 and between the S/D regions 110. The gate 112 includes gate metal (or gate metal stack) 120 disposed between a pair of gate spacers 122. Note that the dummy gates 108 have the exact structure as the active gates 112 except that the dummy gates are not disposed over an active channel 118 and extend partially into the isolation region 114 where there are no active devices.

The gate spacers 122 are composed of a dielectric material such as SiN, SiBCN or similar. For this particular exemplary embodiment, the gate spacers 122 are SiBCN.

The gate metal 120 is typically a stack of gate metals, which generally includes three main groups of structures (not shown). Those three main structures are: the gate dielectric layers (typically a high-k dielectric material), the work-function metal structures (typically TiN, TaN, TiCAl, other metal-nitrides or similar materials) and the gate electrode metal (typically Al, W, Cu or similar metal). The gate dielectric layers are used to electrically insulate the work-function metal structures and the gate electrodes from the substrate. The work-function metal structures are generally metal-nitrides that provide the work-function needed for proper FinFET operation, but typically have 10 to 100 times larger resistivity than the gate electrodes. The gate electrodes are metals with a very low resistivity.

Disposed over the S/D regions 114 and between the gates 112 and dummy gates 108 is an inter-layer dielectric (ILD) 124, which is typically composed of an oxide such as SiO2. The ILD 124 extends upwards from the fins 104 to a first level (i.e., height) 126 above the tops of the fins 104. The first level being substantially equal to the heights of the gates 112 and the ILD 124 at this stage of the process flow.

Figure 2:
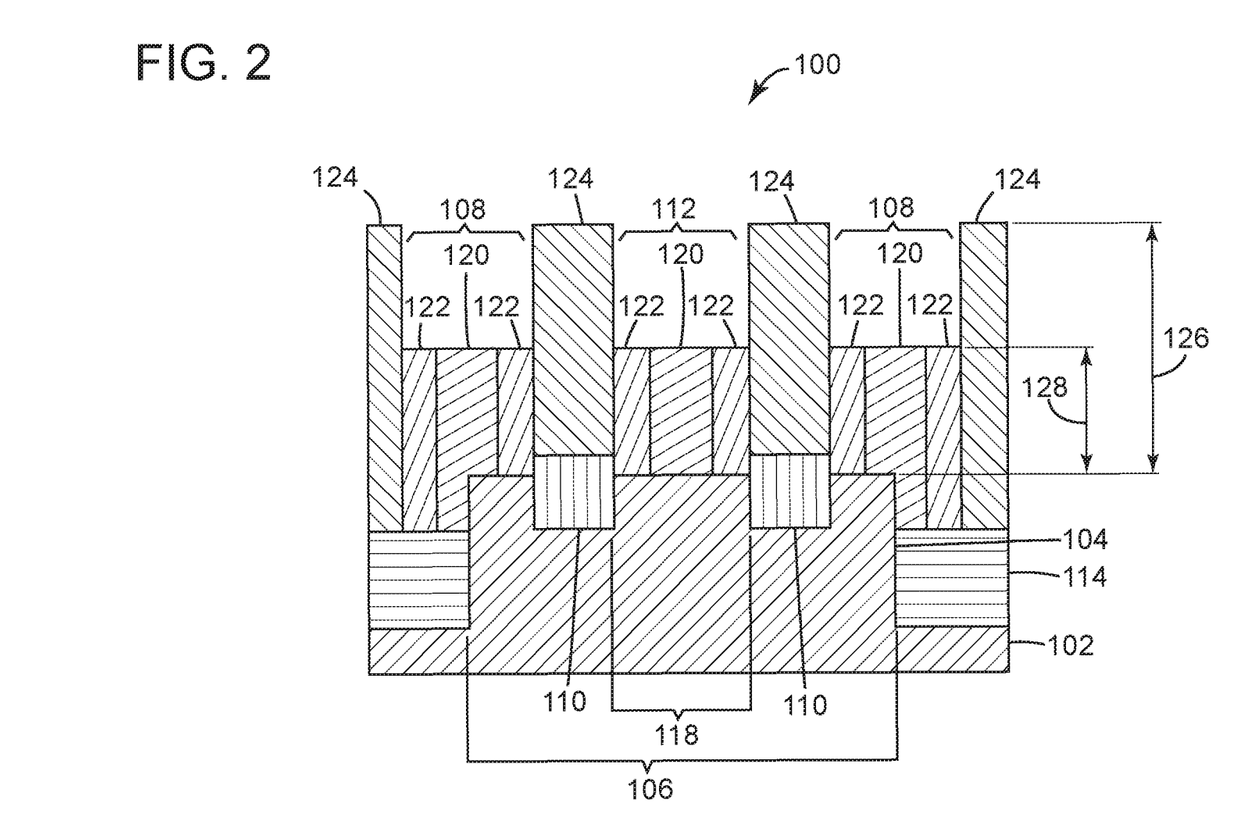
FIG. 2 is a cross-sectional view of FIG. 1B after having a gate recessed in accordance with the present invention.

Referring to FIG. 2, the gates 108, 112 are next recessed down to a second level or gate level 128. That second gate level 128 being the final level (or height) of the gates 108, 112 above the fins 104 in the fully processed structure 100 (best seen in FIGS. 13A and 13B). The gate spacers 122 and gate metal 120 can be recessed in two separate anisotropic etching processes, such as two reactive ion etch (RIE) processes or similar.

Figure 3:
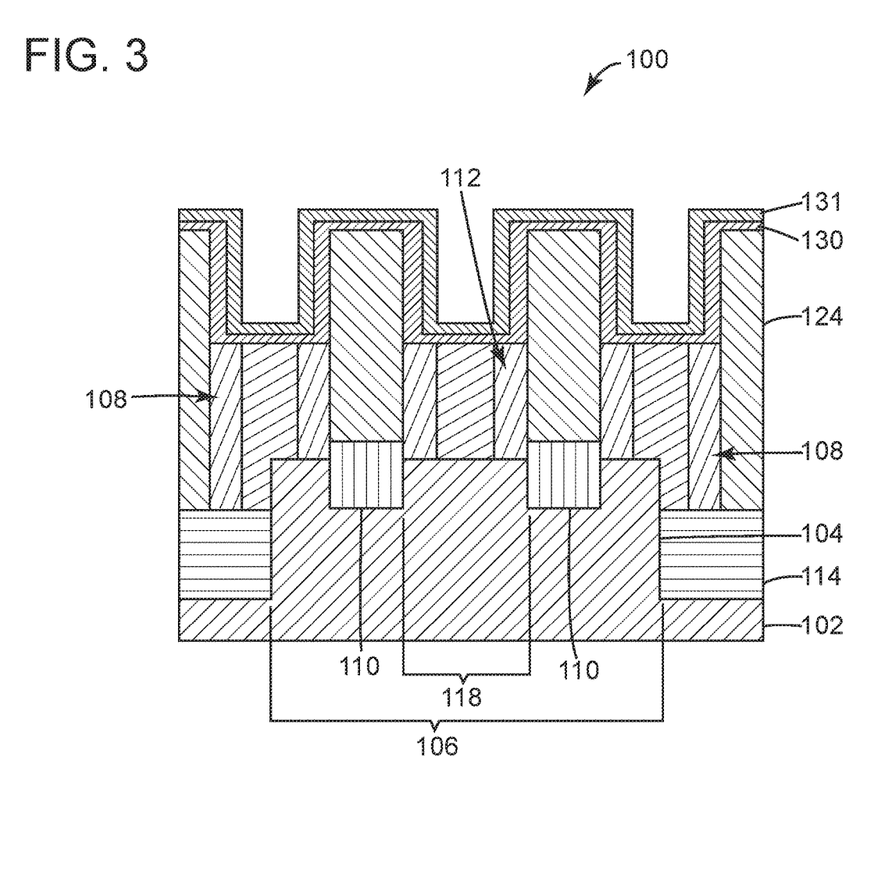
FIG. 3 is a cross-sectional view of FIG. 2 with a protective layer and a liner layer disposed thereon in accordance with the present invention.

Referring to FIG. 3, a liner layer 130 is disposed over the structure 100. The liner layer can be generally conformally coated over the exposed surfaces of the ILD 124 and gates 108, 112 through such processes as atomic layer deposition (ALD) or similar. The liner layer is generally a high-k dielectric having a first material composition such as hafnium dioxide (HfO2), nitride hafnium silicates (HfSiON) or the like. For this particular exemplary embodiment, the liner layer is HfO2. The liner layer is generally very thin and is typically within a range of 3 to 6 nm thick.

Because the liner layer is so thin, a protective layer 131 is next disposed over the liner layer 130 to protect the liner layer during a subsequent etching process. The protective layer may be a nitride, such as silicon nitride (SiN) or similar. The protective layer may be applied through such processes as ALD or similar. For this particular exemplary embodiment the liner layer is SiN.

Figure 4:
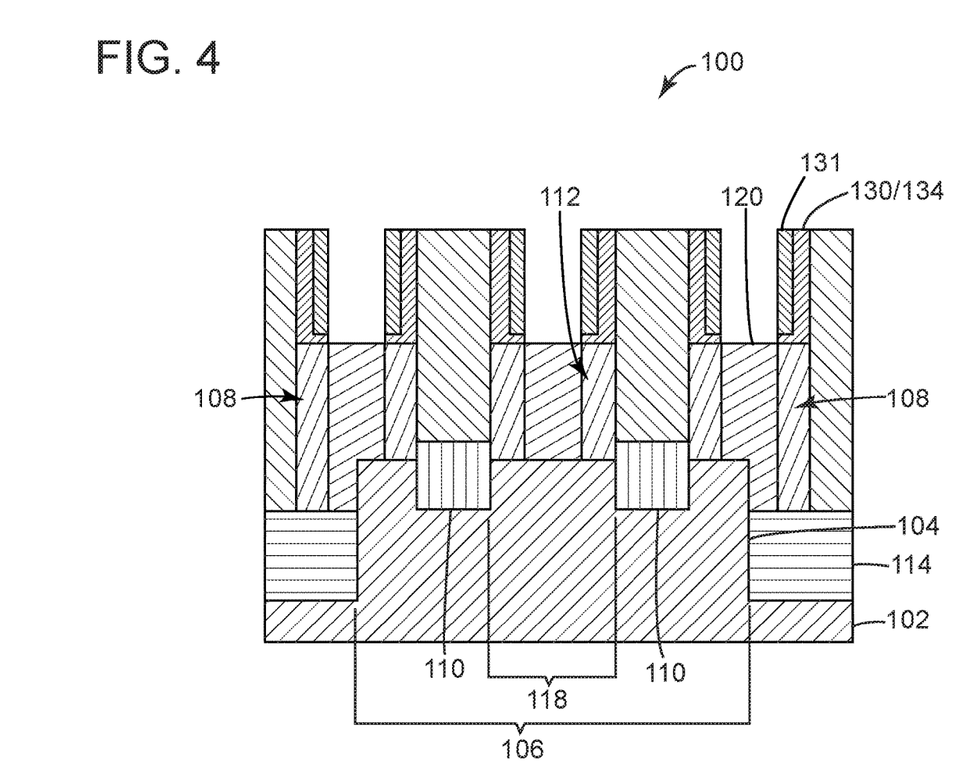
FIG. 4 is a cross-sectional view of FIG. 3 having the protective layer and liner layer anisotropically etched to expose gate metal of the gate in accordance with the present invention.

Referring to FIG. 4, the high-k dielectric liner layer 130 and associated protective layer 131 are next anisotropically etched, as for example, by a RIE or similar. The anisotropic etching process exposes the gate metal 120 at the top of the gates 108, 112. The protective layer 131 prevents the liner layer 130 from being damaged or eroded during this process. The remaining portion of the liner layer 130 forms an outer liner 134 for a cap 132 (best seen in FIG. 5) that will be completely formed in subsequent step.

Figure 5:
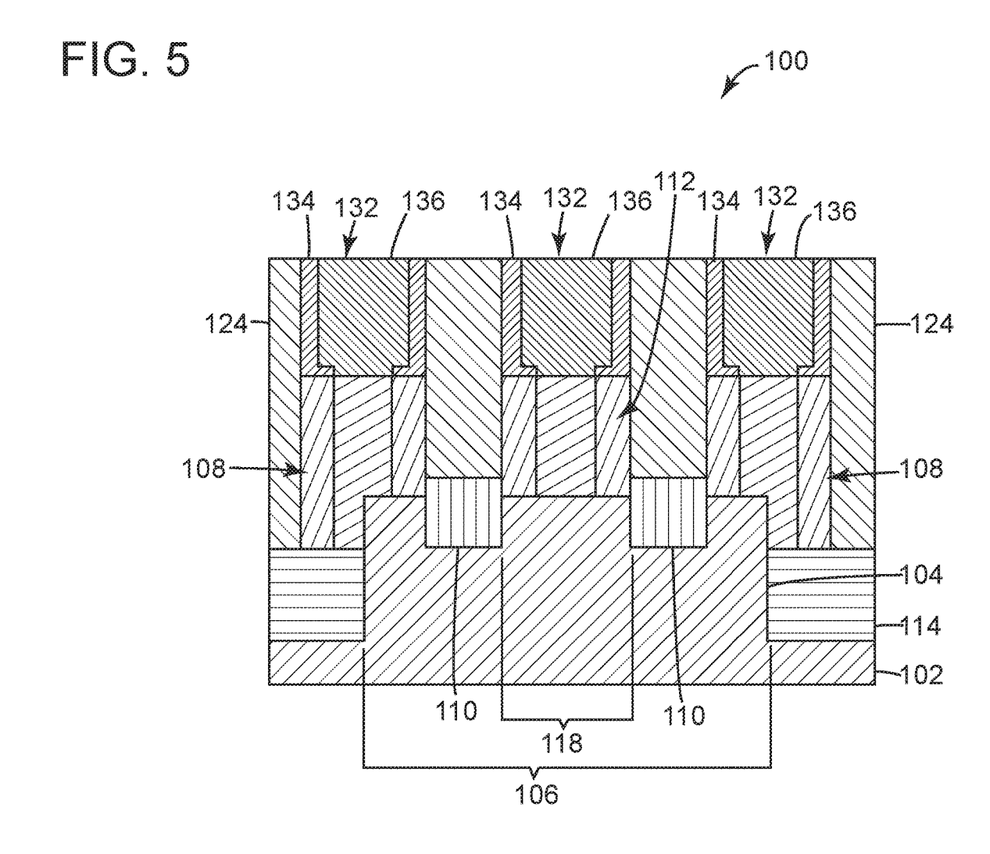
FIG. 5 is a cross-sectional view of FIG. 4 with a cap formed thereon in accordance with the present invention.

Referring to FIG. 5, next a core layer is disposed over liner layer 130 by such means as chemical vapor deposition (CVD), physical vapor deposition (PVD), ALD or the like. The core layer is also generally a dielectric having a second material composition that is different from the first material composition of the liner layer 130. Typically, the core layer may be composed of a nitride such as SiN, SiBCN or similar.

For this particular exemplary embodiment, the core layer is SiN, which is the same material as the protective layer 131. As such, in this embodiment, the protective layer 131 does not have to be removed before deposition of the core layer.

The core layer and liner layer 130 are then planarized down (such as by chemical mechanical planarization (CMP)) to expose the top surfaces of the ILD 124 and to complete the formation of the cap 132 over the gates 108, 112. The cap 132 includes the high-k dielectric outer liner 134 disposed around an inner core 136. As mentioned earlier, the outer liner 134 is formed from that portion of the liner layer 130 which remained after planarization. The inner core 136 is formed from that portion of the core layer which remained after planarization.

Figure 6:
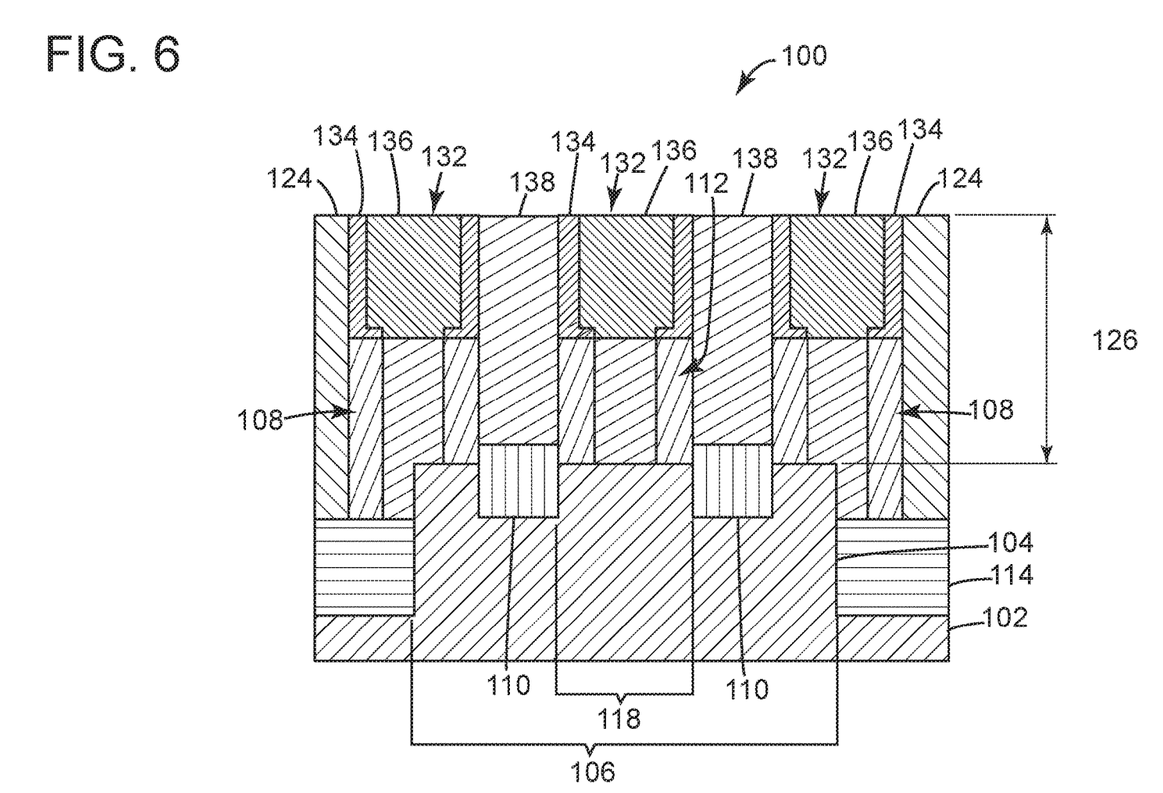
FIG. 6 is a cross-sectional view of FIG. 5 with TS layers disposed thereon in accordance with the present invention.

Referring to FIG. 6, TS trenches (not shown) are formed by removing the ILD layer 124 from between the gates 108, 112 in the Rx region 106 of structure 100 by well-known processes such as by an anisotropic dry etching process. For example, the TS trenches may be patterned by a conventional lithographic process with a TS mask, followed by a plasma dry etch. The plasma etch is self-aligned in nature, wherein the etch process only removes the oxide ILD layer 124 and is selective to the nitride gate cap 132 and spacers 122. TS layers 138 are then formed within the TS trenches.

The TS layers 138 are disposed on opposing sides of the gates 108, 112 and over the S/D regions 110 in place of the ILD layer 124. The TS layers 138 may be disposed by a process of TS metallization. The TS metallization process may include formation of a bottom silicide layer over the S/D regions 110 followed by deposition of a top conducting metal layer. The bottom silicide layer may be composed of Ni, Ti, NiPt silicide or the like. The conducting metal layer may be composed of TiN, TaN and bulk conducting materials such as W, Co or Ru.

Any overfill of the TS layers 138 is planarized down to the first level 126, which is now the level (or height) of the top of the cap 132 (core 136 and/or high-k liner 134) above the top surface of the fin 104. TS layers 138 extend longitudinally across the entire Rx region 106 in order to ensure proper electrical contact with the S/D regions 110 in the array of fins 104 even under worst case misalignment conditions.

Figure 7:
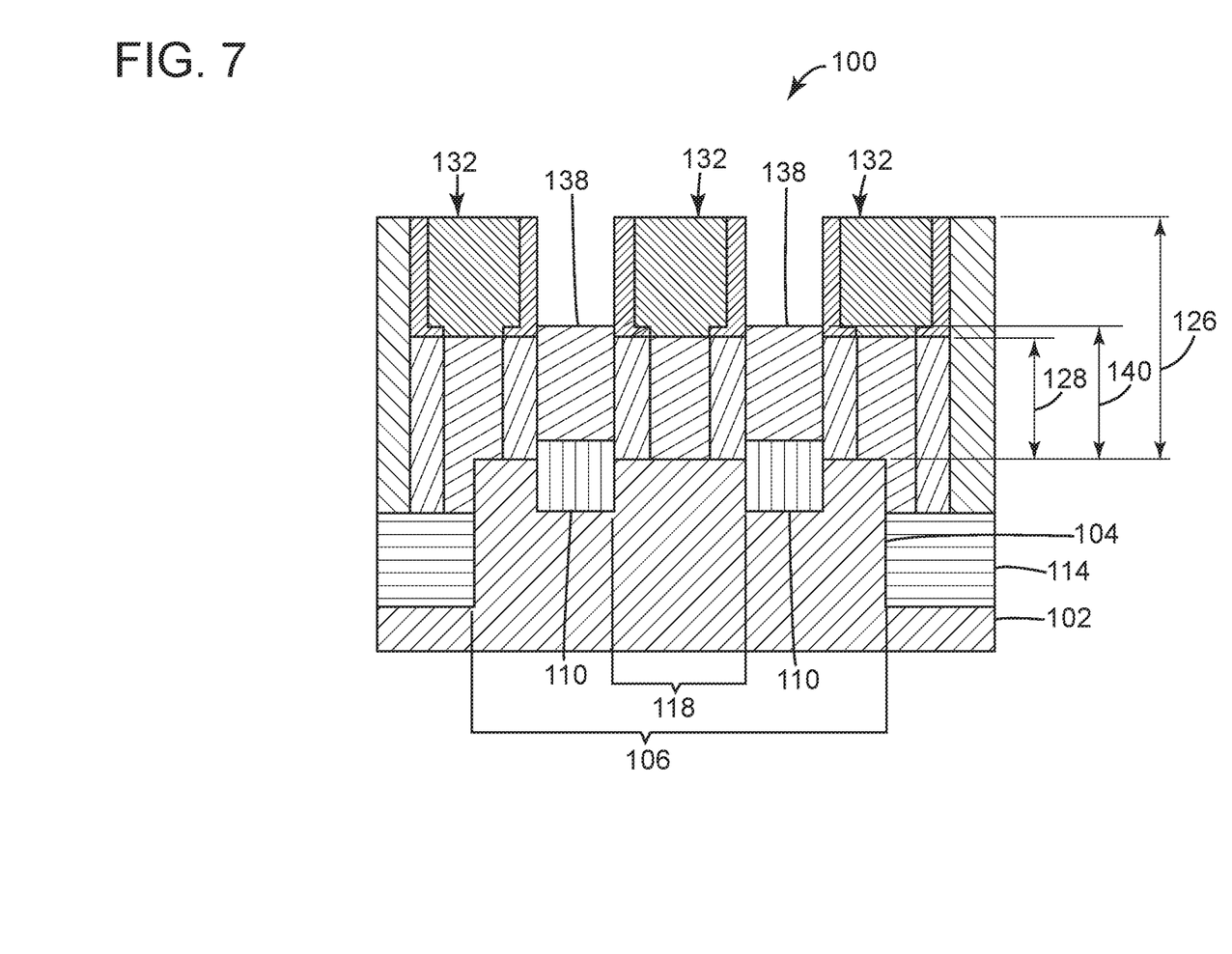
FIG. 7 is a cross-sectional view of FIG. 6 with the TS layers recessed in accordance with the present invention.

Referring to FIG. 7, the TS layers 138 are then recessed to a third level 140 that is above the level 128 of the gates 108, 112 and below the level 126 of the core 132. The recess can be accomplished by a timed anisotropic etch of the TS layers 138, such as by reactive ion etching (RIE) or similar.

It is important to note that this recess of TS layers 138 is shallow compared to prior art methods of forming a CB contact in the Rx regions. In those prior art methods, the TS layers are recessed well below the level 128 of the gates 108, 112. In the present embodiment, the TS layers 138 are typically recessed within a range of 15 to 30 nm, which is typically about 25 to 50 percent of the height of the original TS layers. However, prior art methods of forming CB contacts in Rx regions recess the TS layers as much as reasonably possible without excessively increasing the overall resistance of the TS layers. Accordingly, the prior art methods recess the TS layers well below 50 percent of the original height of the TS layers and well below the level 128 of the gates 108, 112.

Figure 8:
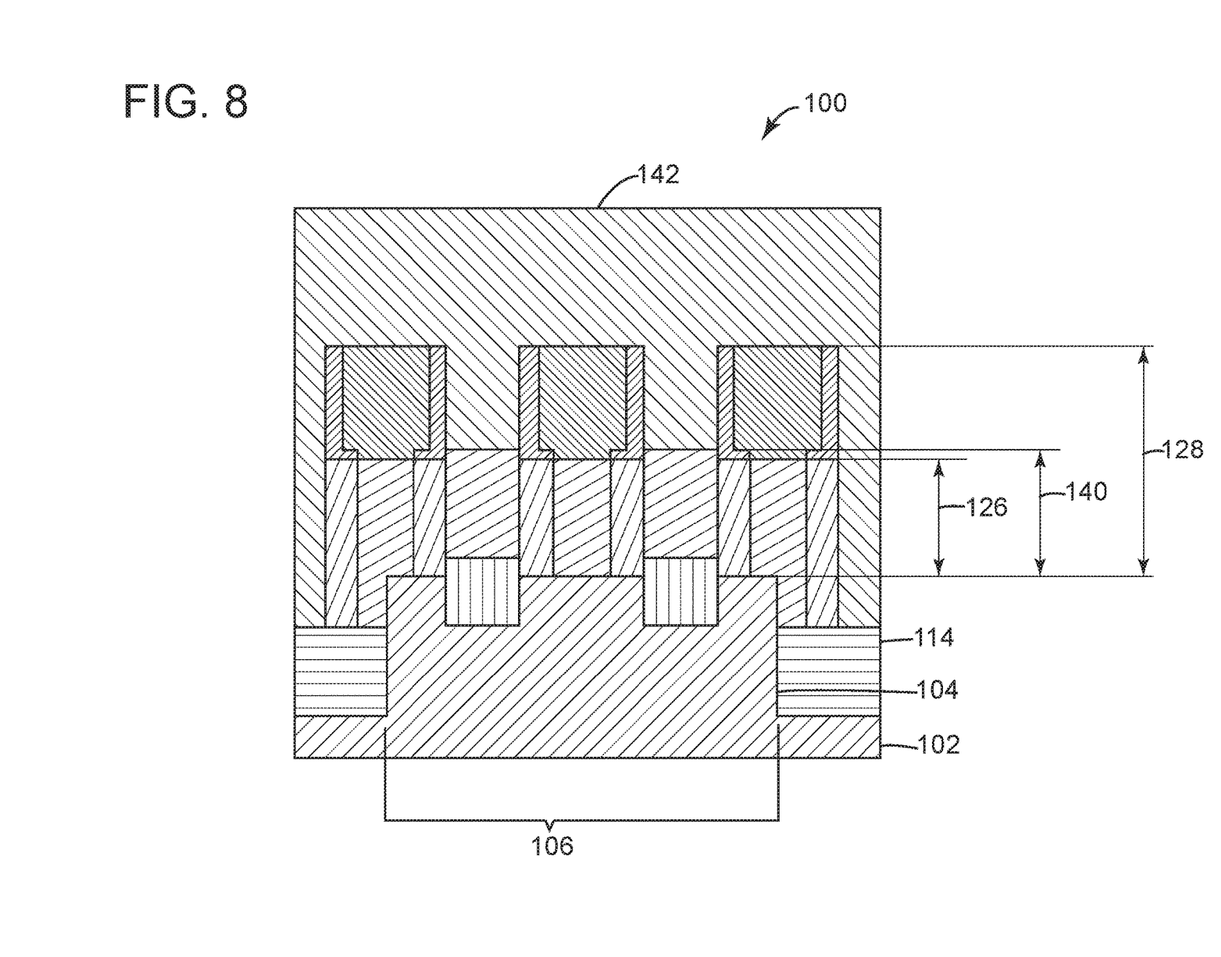
FIG. 8 is a cross-sectional view of FIG. 7 with an oxide layer disposed thereon in accordance with the present invention.

Referring to FIG. 8, an oxide fill layer (or oxide layer) 142 is disposed over the structure 100. The oxide fill layer 142 will be used for subsequent patterning of a CB trench (best seen in FIG. 12A) and CA trenches (best seen in FIG. 9C)

Figures 9A, 9C:
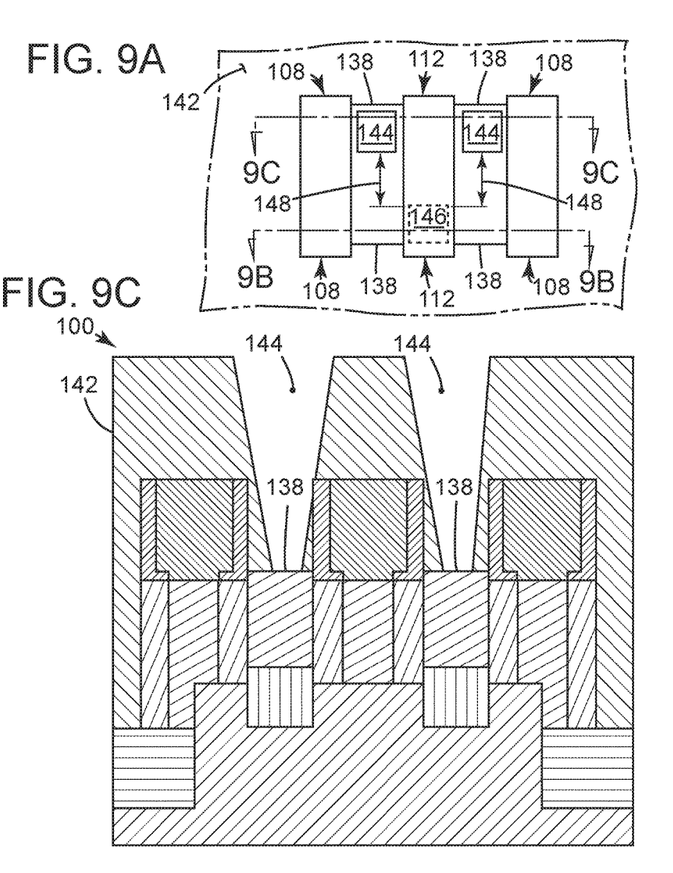
FIG. 9A is a top planar view of FIG. 8 showing the features of structure 100 that underlay the oxide layer (represented as a phantom-lined boundary), wherein a pair of CA trenches are disposed in the oxide layer and a dotted line perimeter represents the targeted location of a yet to be formed CB trench in the oxide layer in accordance with the present invention.
FIG. 9C is a simplified cross-sectional view of FIG. 9A taken along the line 9C-9C in accordance with the present invention.
Figure 9B:
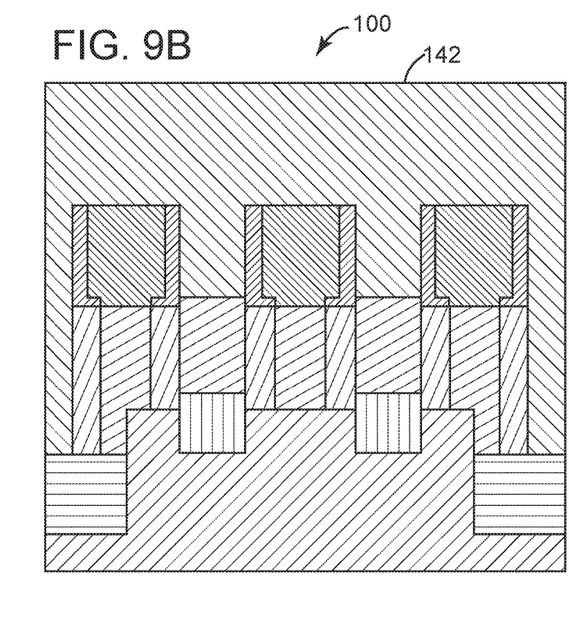
FIG. 9B is a simplified cross-sectional view of FIG. 9A taken along the line 9B-9B in accordance with the present invention.

Referring to FIGS. 9A, 9B and 9C, a pair of CA trenches 144 (best seen in FIG. 9C) are patterned into the oxide fill layer 142 to expose the TS layers 138 thereunder. Later in the process flow, the CA trenches will be metalized to form a pair of CA contacts 160 (best seen in FIG. 13B) that are electrically connected to the TS layers 138. The CA trenches 144 may be anisotropically etched as by a RIE process or similar. Cross-sectional view 9B shows the location of where a yet to be formed CB trench 146 will also be patterned and metalized to form a CB contact 162 (best seen in FIG. 13A).

For clarity purposes, top planar view of FIG. 9A shows the features of structure 100 that underlay the oxide layer 142, wherein the oxide layer 142 is represented as a phantom-lined boundary. Additionally, a dotted line perimeter of CB trench 146 is shown in the top planar view 9A and represents the targeted location of the CB trench 146 that will be disposed into the oxide fill layer 142 in subsequent process steps.

Figure 13A:
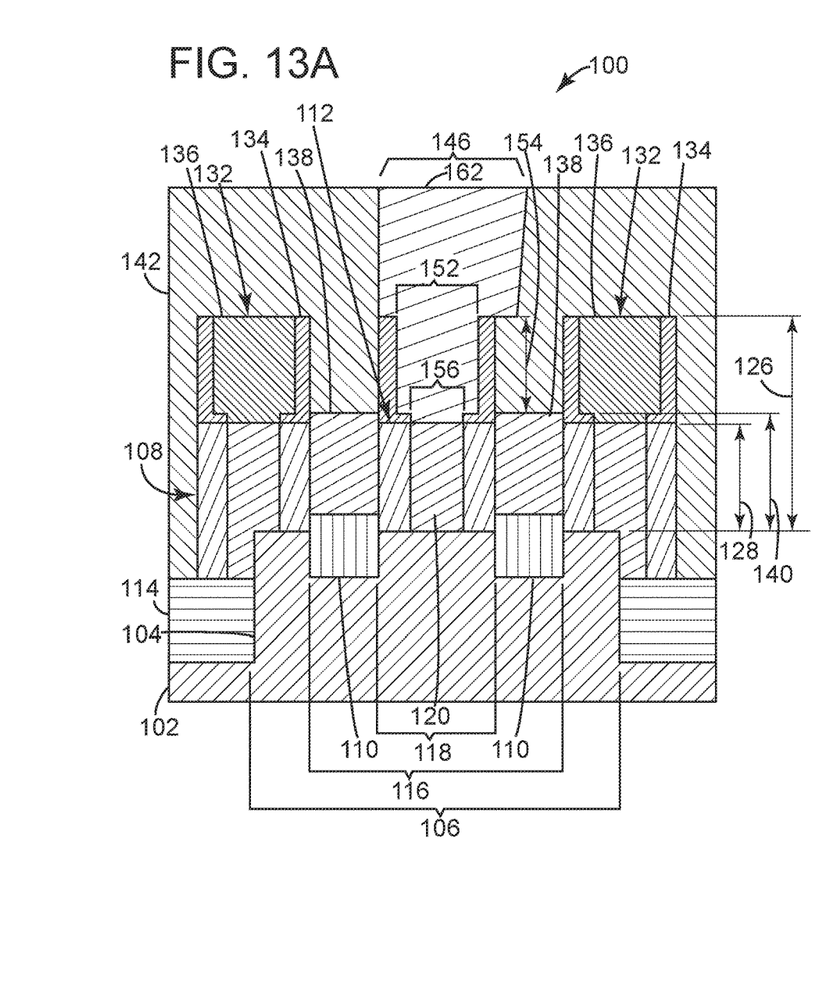
FIG. 13A is a cross-sectional view of FIG. 12A having the CB trench metalized to form a CB contact in accordance with the present invention.
Figure 13B:
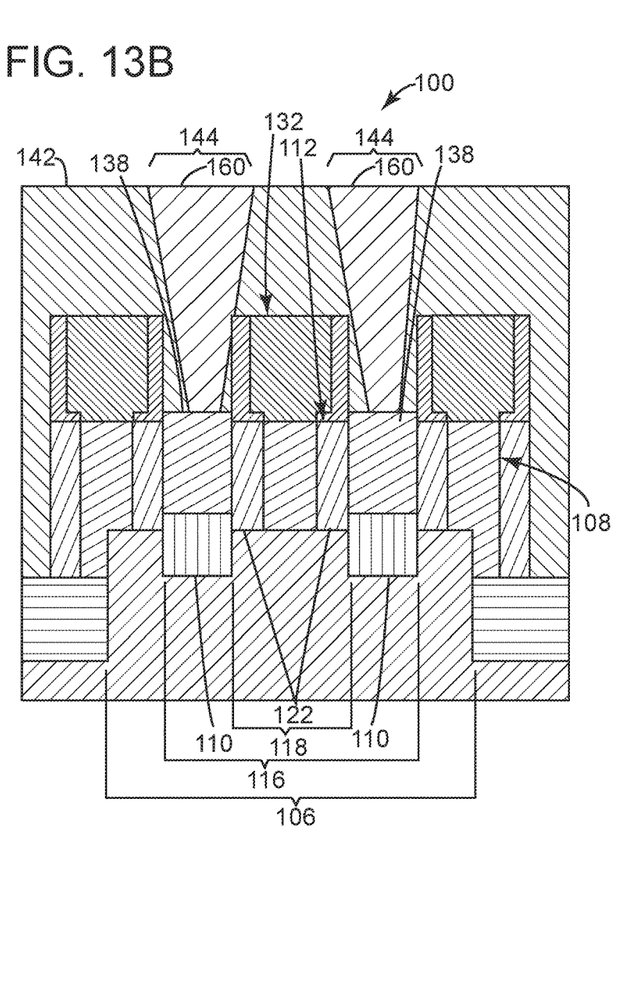
FIG. 13B is a cross-sectional view of FIG. 12B having the CA trenches metalized to form CA contacts in accordance with the present invention.

It is important to note that the CA trenches 144 and CB trench 146 must be located a sufficient distance 148 apart in a direction that is parallel to the gate 112 to substantially prevent electrical shorting between the CB contact 162 and CA contacts 160 (best seen in FIG. 13B). The distance 148 must take into consideration worst case misalignment tolerances due to unavoidable manufacturing variations and still be able to prevent such shorting. Typically distance 148 would be within a range of 15 to 30 nm or greater, depending on the overall width of the Rx region.

Figure 10A:
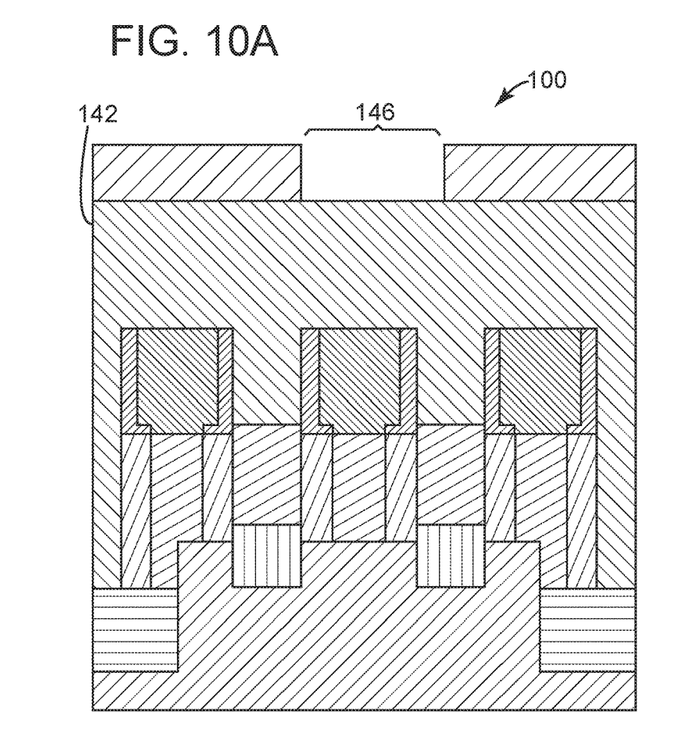
FIG. 10A is a cross-sectional view of FIG. 9B having an organic planarization layer (OPL) disposed thereon and a CB trench disposed within the OPL in accordance with the present invention.
Figure 10B:
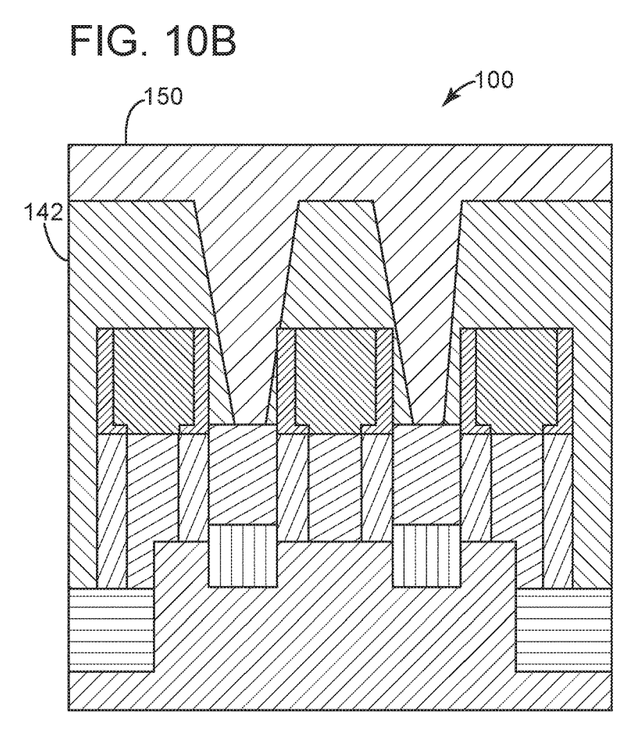
FIG. 10B is a cross-sectional view of FIG. 9C having an OPL disposed thereon in accordance with the present invention.

Referring to FIGS. 10A and 10B, an organic planarization layer (OPL) 150 is next disposed over the structure 100. The CB trench 146 is then patterned and etched into the OPL layer 150 by such processes as a RIE etch or similar. Though the process flow of this embodiment shows the CB trench 146 formed after the CA trenches, one skilled in the art would recognize that the CB trench may be formed first in the process flow.

Figure 11A:
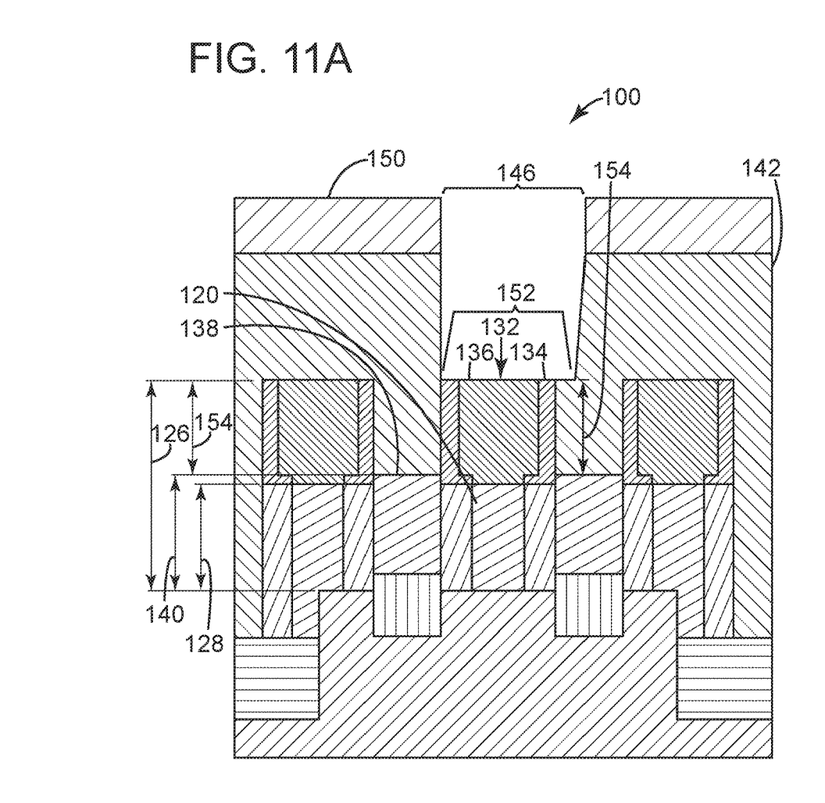
FIG. 11A is a cross-sectional view of FIG. 10A having the CB trench etched into the oxide layer in accordance with the present invention.
Figure 11B:
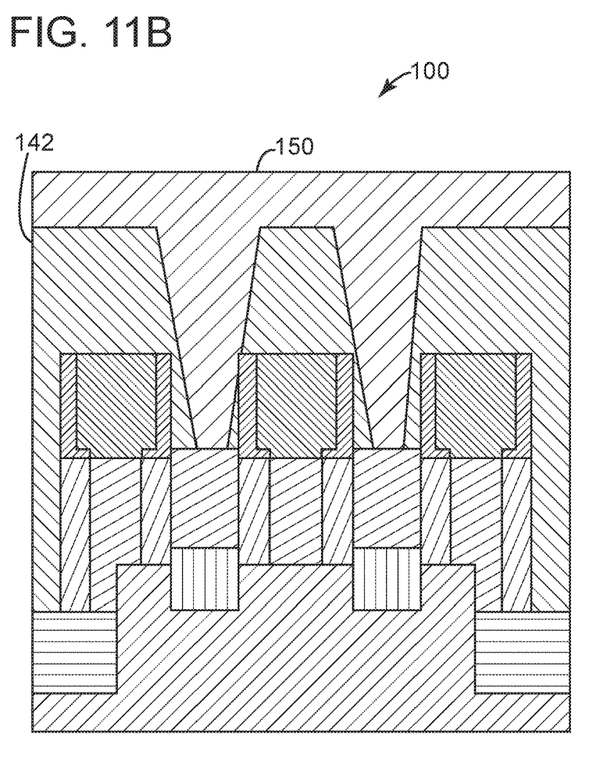
FIG. 11B is a cross-sectional view of FIG. 10B in accordance with the present invention.

Referring to FIGS. 11A and 11B, the CB trench 146 is patterned and etched further into the oxide layer 142 to expose the top surface of the cap 132 at an intermediate portion 152 of the CB trench 146. The etching process, again, may be a RIE process.

The intermediate portion 152 is targeted to land on at least a portion of the cap's inner core 136 that is directly above the gate metal 120. This is because, as will be discussed in greater detail in subsequent steps, the CB trench 146 will be etched further down from the intermediate portion 152 to a trench bottom 156 (best seen in FIG. 12A) to expose the gate metal 120.

However, due to lithographic and other manufacturing tolerances, the intermediate portion 152 of CB trench 146 may land on other parts of the cap 132, including parts of the core 136 that do not lay directly over the gate metal 120 or the gate high-k dielectric liner 134. Under worst case manufacturing tolerances, the intermediate portion 152 may even extend partially into the oxide fill layer 142 at about the level 126 of the cap 132, as illustrated in this particular embodiment. Moreover, the landing of the intermediate portion 152 on the top surface of the cap 132, may even etch the top surface down slightly below the cap level 126 by about two to five nm.

Note that the cap 132 extends up to the cap level 126 that is a distance 154 above the level 140 of the TS layer 138, which is also substantially the distance of the intermediate portion 152 above the TS layers 138. That distance 154 is predetermined to be a sufficient vertical distance of the intermediate portion 152 from any TS layers 138 to substantially prevent electrical shorting between any metal disposed upon the intermediate portion and any TS layers within the Rx region 106.

The distance 154 must take into consideration worst case misalignment and other tolerances due to unavoidable manufacturing variations and still be able to prevent such shorting. Typically distance 154 would be within a range of 10 to 30 nm.

Figure 12A:
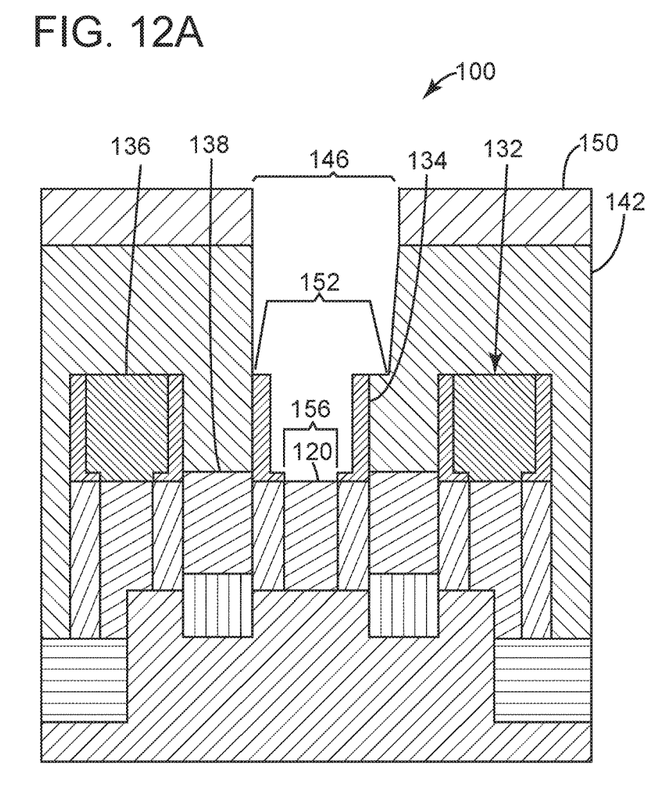
FIG. 12A is a cross-sectional view of FIG. 11A having the CB trench etched down to gate metal of the gate in accordance with the present invention.
Figure 12B:
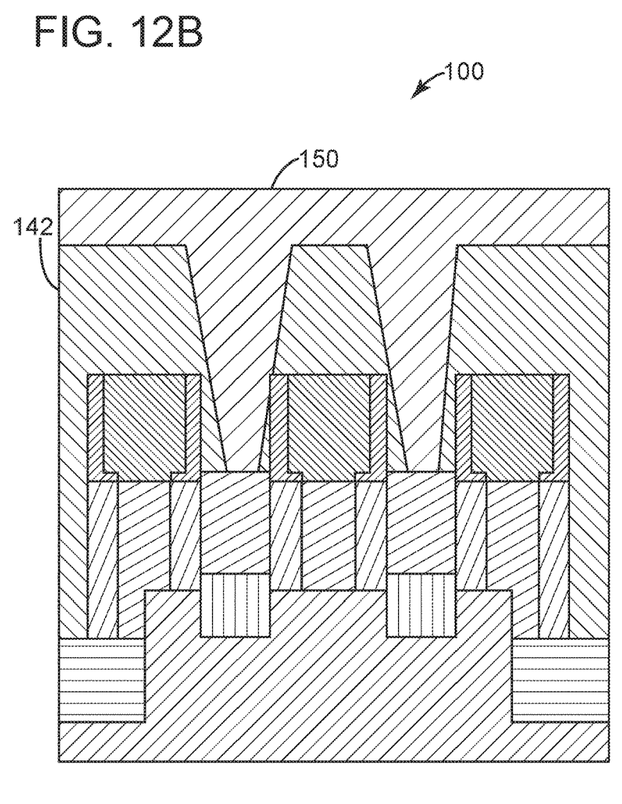
FIG. 12B is a cross-sectional view of FIG. 11B in accordance with the present invention.

Referring to FIGS. 12A and 12B, next in this embodiment the core 136 is selectively anisotropically etched relative to the liner 134 to further extend the CB trench 146 to a trench bottom 156 and to expose the gate metal 120. The anisotropic etching may be done by a RIE process or similar.

The differences between the first material composition of high-k dielectric liner 134, the second material composition of the core 136 and the third material composition of the oxide fill layer 142 makes the first core material very selective in an anisotropic etch process (such as a RIE) relative to the second and third materials of the liner and oxide fill layer. Accordingly, the core 136 can be etched down to expose the gate metal 120 without etching the high-k dielectric liner 134 or the oxide fill layer 142.

This is important because the high-k dielectric liner 134 is required, in this embodiment, to prevent shorting between any CB contact 162 (best seen in FIG. 13A) disposed within CB trench 146 and the TS layer 138. Even though the liner 134 is typically only 3 to 6 nm thick, its high-k material composition provides enough electrical insulation to prevent shorting between the CB contact 162 and the TS layer 138. Additionally, the unetched liner 134 serves to self-align the CB contact 162 with the gate metal 120.

Referring to FIGS. 13A and 13B, the OPL layer is 150 is stripped away as, for example, by wet etch process or similar. Then the CA trenches 144 and CB trench 146 are metalized as, for example, by CVD, PVD, electroless metal plating or similar, to form CA contacts 160 in the CA trenches 144 and a CB contact 162 in the CB trench 146. The CB contact 162 is electrically connected to the gate metal 120 and the CA contacts 160 are electrically connected to the TS layers 138.

At this final stage of the process flow, the finished semiconductor structure 100 now includes the FinFET 116 disposed in the Rx region 106. The FinFET 116 includes the channel 118 disposed between the pair of source/drain (S/D) regions 110 and the gate 112 disposed over the channel 118. The gate 112 includes the gate metal 120 disposed between the gate spacers 122. The cap 132 is disposed over the gate 112. The cap includes the high-k dielectric outer liner 134 disposed around the cap core 136. The trench silicide (TS) layers 138 are disposed on opposing sides of the gate 112 over the S/D regions 110. The TS layers 138 have a level 140 above a level 128 of the gate 112 and below a level 126 of the cap 132. The oxide layer 142 is disposed over the structure 100. The CB trench 146 is disposed within the oxide layer 142 and over the Rx region 106. The CB trench 146 extends down to the trench intermediate portion 152 located at substantially the level 126 of the cap 132 and further extends from the intermediate portion 152 to the trench bottom 156. The trench bottom includes the gate metal 120. The CB contact 162 is disposed within the CB trench 146 and is electrically connected to the gate metal 120.

Additionally the semiconductor structure 100 now includes the pair of source/drain (CA) contacts 160 for the FinFET 116, which are also disposed within oxide layer 142. The CA contacts electrically connect to the TS layers 138, which overlay the S/D regions 110 of the FinFET 116. The CA contacts 160 are located a sufficient distance 148 (best seen in FIG. 9A) away from the CB contact 162 in a direction parallel to the gate 112 to substantially prevent electrical shorting between the CB contact 162 and the CA contacts 160.

Moreover, the Rx region 106 of the semiconductor structure 100 further includes a plurality of fins 104 (best seen in FIG. 1A) extending perpendicular to the gate 112. A plurality of FinFETs 116 are disposed in the fins 104. Each FinFET 116 includes a channel 118 disposed between a pair of S/D regions 110, wherein the gate 112 is disposed over the channels 118 of each FinFET 116 and the TS layers 138 are disposed on opposing sides of the gate 112 over the S/D regions 110 of each FinFET 116.

Advantageously, both CA contacts 160 and CB contacts 162 are disposed within the Rx region 106 of structure 100 and are spaced a sufficient distance away from any TS layers 138, and from each other, to substantially prevent electrical shorting. The form and spacing of CA Contacts 160 and CB contact 162 take into consideration worst case misalignment and other tolerances due to unavoidable manufacturing variations to prevent such shorting. Accordingly, the structure 100 is readily manufacturable and can be scaled down to the 10 nm technology node and beyond.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A semiconductor structure comprising:
a FinFET disposed in an Rx region, the FinFET including a channel disposed between a pair of source/drain (S/D) regions and a gate disposed over the channel, the gate including gate metal disposed between gate spacers;
a cap including a high-k dielectric outer liner disposed around an inner core, the cap being disposed over the gate, the cap liner and core extending upwards from the gate to substantially a same first cap level;
trench silicide (TS) layers disposed on opposing sides of the gate over the S/D regions, the TS layers having a level above a level of the gate and below the cap level;
an oxide layer disposed over the structure;
a CB trench disposed within the oxide layer and over the Rx region, the CB trench extending down to a trench intermediate portion located at substantially the cap level and further extending from the intermediate portion to a trench bottom, the trench bottom including the gate metal; and
a CB contact disposed within the CB trench and electrically connected to the gate metal.

2. The semiconductor structure of claim 1 wherein the cap outer liner has a high-k dielectric first material composition and the cap inner core has a second material composition different from the first material composition.

3. The semiconductor structure of claim 2 wherein the first material is an HfO2.

4. The semiconductor structure of claim 2 wherein the second material is one of SiN, SiBCN and SiCO.

5. The semiconductor structure of claim 1 wherein the intermediate portion of the CB trench is located a sufficient distance from any TS layers to substantially prevent electrical shorting between the CB contact and the TS layers within the Rx region.

6. The semiconductor structure of claim 1 comprising the TS layers having a level that is within a range of 25 to 50 percent of the cap level.

7. The semiconductor structure of claim 1 comprising the TS layers having a level that is within a range of 15 to 30 nm below the cap level.

8. The semiconductor structure of claim 1 comprising a pair of source/drain (CA) contacts for the FinFET being disposed within oxide layer, the CA contacts electrically connecting to the TS layers overlaying the S/D regions of the FinFET, the CA contacts located a sufficient distance away from the CB contact in a direction parallel to the gate to substantially prevent electrical shorting between the CB contact and the CA contacts.

9. The semiconductor structure of claim 1 wherein the section of the CB trench extending down from the intermediate portion of the CB trench to the trench bottom has a cross-section substantially equal in area to the lateral cross-section of the core.

10. The semiconductor structure of claim 1 comprising:
the Rx region including a plurality of fins extending perpendicular to the gate;
a plurality of FinFETs disposed in the fins, each FinFET including a channel disposed between a pair of S/D regions, wherein the gate is disposed over the channels of each FinFET; and
the TS layers disposed on opposing sides of the gate over the S/D regions of each FinFET.

* * * * *